(12) United States Patent
Takahara

(10) Patent No.: US 8,466,719 B2
(45) Date of Patent: Jun. 18, 2013

(54) FREQUENCY DOUBLER, SIGNAL GENERATOR, OPTICAL TRANSMITTER, AND OPTICAL COMMUNICATION APPARATUS

(75) Inventor: Tomoo Takahara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 723 days.

(21) Appl. No.: 12/320,593

(22) Filed: Jan. 29, 2009

(65) Prior Publication Data

US 2009/0279895 A1     Nov. 12, 2009

(30) Foreign Application Priority Data

May 9, 2008 (JP) .................................. 2008-123961

(51) Int. Cl.
*H03B 19/00* (2006.01)

(52) U.S. Cl.
USPC ........................................ 327/116; 327/119

(58) Field of Classification Search
USPC ........................ 327/122, 116, 119, 120, 121
See application file for complete search history.

(56) References Cited

U.S. PATENT DOCUMENTS

| 6,480,045 B2 * | 11/2002 | Albean .......................... 327/119 |
| 6,720,806 B1 * | 4/2004 | Merrill et al. .................. 327/116 |
| 2003/0117188 A1 | 6/2003 | Nakanishi |

FOREIGN PATENT DOCUMENTS

| JP | 01-152815 | 6/1989 |
| JP | 04-105724 | 9/1992 |
| JP | 04-266213 | 9/1998 |
| JP | 2000-183700 | 6/2000 |
| JP | 2002-064367 | 2/2002 |
| JP | 2003-198339 | 7/2003 |
| JP | 2005-229411 | 8/2005 |
| JP | 2007-251735 | 9/2007 |

OTHER PUBLICATIONS

Japanese Notice of Rejection mailed Mar. 5, 2013 corresponds to Japanese Patent Application No. 2008-123961.
Japanese Notice of Rejection mailed Jun. 5, 2012 corresponds to Japanese Patent Application No. 2008-123961.

* cited by examiner

*Primary Examiner* — Hai L Nguyen
(74) *Attorney, Agent, or Firm* — Staas & Halsey LLP

(57) ABSTRACT

An input unit receives input of a clock signal having a voltage that varies continuously. A supply unit supplies a constant reference voltage. A selector outputs a clock signal having voltage that is changed alternately each time the voltage of the clock signal input from the input unit shifts across the reference voltage supplied from the supply unit. A calculating circuit outputs the exclusive-OR of the clock signal input from the input unit and a clock signal output from the selector.

10 Claims, 18 Drawing Sheets

FREQUENCY DOUBLER, SIGNAL GENERATOR, OPTICAL TRANSMITTER, AND OPTICAL COMMUNICATION APPARATUS

CROSS-REFERENCE TO RELATED APPLICATIONS

This application is based upon and claims the benefit of priority from the prior Japanese Patent Application No. 2008-123961, filed on May 9, 2008, the entire contents of which are incorporated herein by reference.

BACKGROUND OF THE INVENTION

1. Field of the Invention

The present invention relates to a frequency doubler, a signal generator, an optical transmitter, and an optical communication apparatus.

2. Description of the Related Art

The development of an ultrafast optical communication system has been in progress, leading to practical application of a system achieving a transmission rate of 40 Gb/s. Meanwhile, a quest for high-speed processing by an electronic circuit has completed the first stage of progress, and has been replaced with an effort to increase the processing speed of a system through a well devised circuit. A typical example of such a well devised circuit is a serializer/deserializer, which is a central component of a transmitter/receiver.

A complementary metal oxide semiconductor (CMOS) demonstrating superior power consumption performance has difficulty achieving a desirable transmission rate, which has lead to attempts to achieve faster operation by combining the CMOS with a multiplexer (MUX) that employs a compound semiconductor. In addition, the adoption of a half-rate configuration in a serializer is an important technique for achieving faster operation.

To generate a high-speed clock used in a serializer and such, a frequency doubler (clock doubler) is used as a circuit that multiplies the original oscillation (see, e.g., Japanese Patent Application Laid-Open Publication Nos. 2003-198339 and 2000-183700). The frequency doubler has a configuration, for example, such that one branch of a clock signal is delayed through a delay circuit by T/4 (hereinafter, T denotes the period of a clock signal) and the exclusive-OR of the clock signal is calculated.

According to the conventional technique above, however, when the delay rate of each clock signal input to a calculating circuit calculating the exclusive-OR shifts from T/4 (which is 2.5 ps if a transmission rate is 100 Gb/s), the duty cycle of a clock signal output from the calculating circuit consequently shifts, which is a problem. For example, depending on the presence/absence of an error correction process (forward error correction (FEC)), multirate transmission may be desirable in an optical communication system.

In multirate transmission, T/4 is not a fixed value and hence, a fixed delay rate at a delay circuit that delays one of the branched clock signals is not compatible with multirate transmission. Further, a fixed delay rate at the delay circuit cannot cope with a change in the delay rate clock signals resulting from fabrication variations and time-dependent changes in a circuit.

A shift in the delay rate of each clock signal input to the calculating circuit calculating the exclusive-OR from an optimum point (e.g., T/4) results in a shift in the duty cycle of a clock signal output from the calculating circuit. Consequently, in a serializer, etc., that employs a frequency doubler, a problem arises in that a shift in the duty of the serial signal output occurs and the quality of the signal degrades.

SUMMARY OF THE INVENTION

It is an object of the present invention to at least solve the above problems in the conventional technologies.

A frequency doubler according to one aspect of the present invention includes an input unit that receives input of a clock signal having a voltage that varies continuously; a selector that outputs a clock signal having a voltage that is switched alternately in synchronization with the clock signal from the input unit; and a calculating circuit that outputs an exclusive-OR of the clock signal input from the input unit and the clock signal output from the selector.

A signal generator according to another aspect of the present invention includes the frequency doubler described above and a multiplexing unit that time division multiplexes a plurality of signals according to the clock signal output from the calculating circuit.

An optical transmitter according to still another aspect of the present invention includes the frequency doubler described above and a modulator that modulates light, based on a time division multiplexed signal from the multiplexing unit.

An optical communication apparatus according to yet another aspect of the present invention includes the optical transmitter described above and an optical receiver that receives an optical signal.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Referring to the accompanying drawings, exemplary embodiments according to the present invention are explained in detail below.

Figure 1:
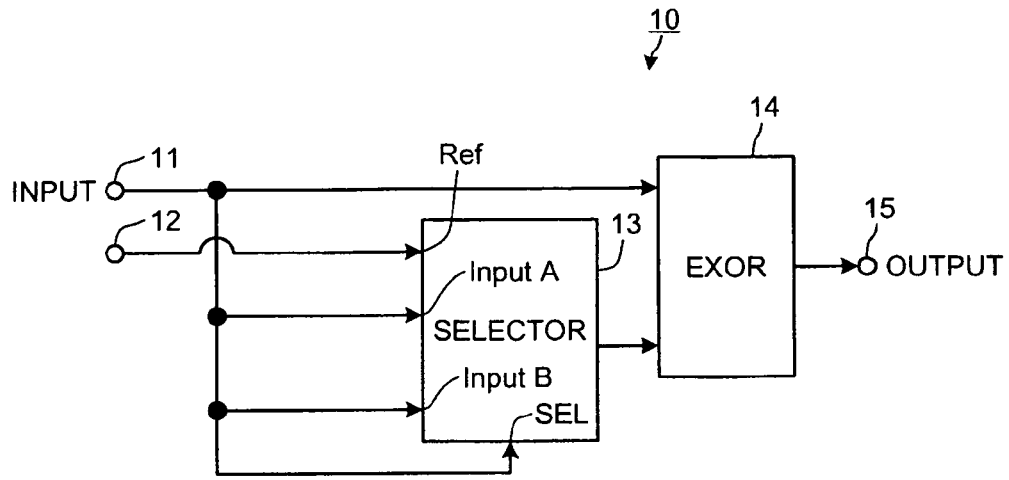
FIG. 1 is a circuit diagram of a frequency doubler according to a first embodiment.

FIG. 1 is a circuit diagram of a frequency doubler according to a first embodiment. As depicted in FIG. 1, a frequency doubler 10 according to the first embodiment includes an input unit 11, a supply unit 12, a selector 13, a calculating circuit 14, and an output unit 15. The frequency doubler 10 is a frequency doubler that outputs a clock signal having a frequency two times the frequency of a clock signal input through the input unit 11.

A clock signal whose voltage changes continuously is input to the input unit (INPUT) 11, which outputs the input clock signal to the calculating circuit 14 and to the selector 13. The supply unit 12 supplies a constant reference voltage to a Ref terminal of the selector 13. The reference voltage supplied from the supply unit 12 to the selector 13 is higher than the minimum voltage of the clock signal output from the input unit 11 to a SEL terminal of the selector 13 and is lower than the maximum voltage of the clock signal.

The selector 13 has input terminals including an InputA terminal, an InputB terminal, the SEL terminal, and the Ref terminal. The clock signal output from the input unit 11 is input to the SEL terminal of the selector 13. The clock signal output from the input unit 11 is branched and input to the InputA terminal and the InputB terminal of the selector 13.

The Ref terminal of the selector 13 is supplied with the reference voltage from the supply unit 12. The selector 13 outputs a clock signal in which the voltages are switched alternately. The selector 13 alternately switches the voltage output each time the voltage of the clock signal input to the SEL terminal shifts across the reference voltage supplied to the Ref terminal. The selector 13 uses the voltages of the signals input to the InputA terminal and the InputB terminal as two voltages that are alternately switched.

For example, when the voltage of a clock signal input to the SEL terminal shifts across the reference voltage from a lower voltage to a higher voltage, the selector 13 outputs the clock signal that is input to the InputA terminal at that time, and latches the voltage of the clock signal. Then, when the voltage of the clock signal input to the SEL terminal shifts across the reference voltage a higher voltage to a lower voltage, the selector 13 outputs the clock signal that is input to the InputB terminal at that time, and latches the voltage of the clock signal.

The clock signal output from the selector 13 is output to the calculating circuit 14 (EXOR), which outputs, to the output unit 15, the exclusive-OR of the clock signal output from the input unit 11 and the clock signal output from the selector 13. The output unit 15 (OUTPUT) outputs the signal input from the calculating circuit 14 to an external destination.

Figure 2:
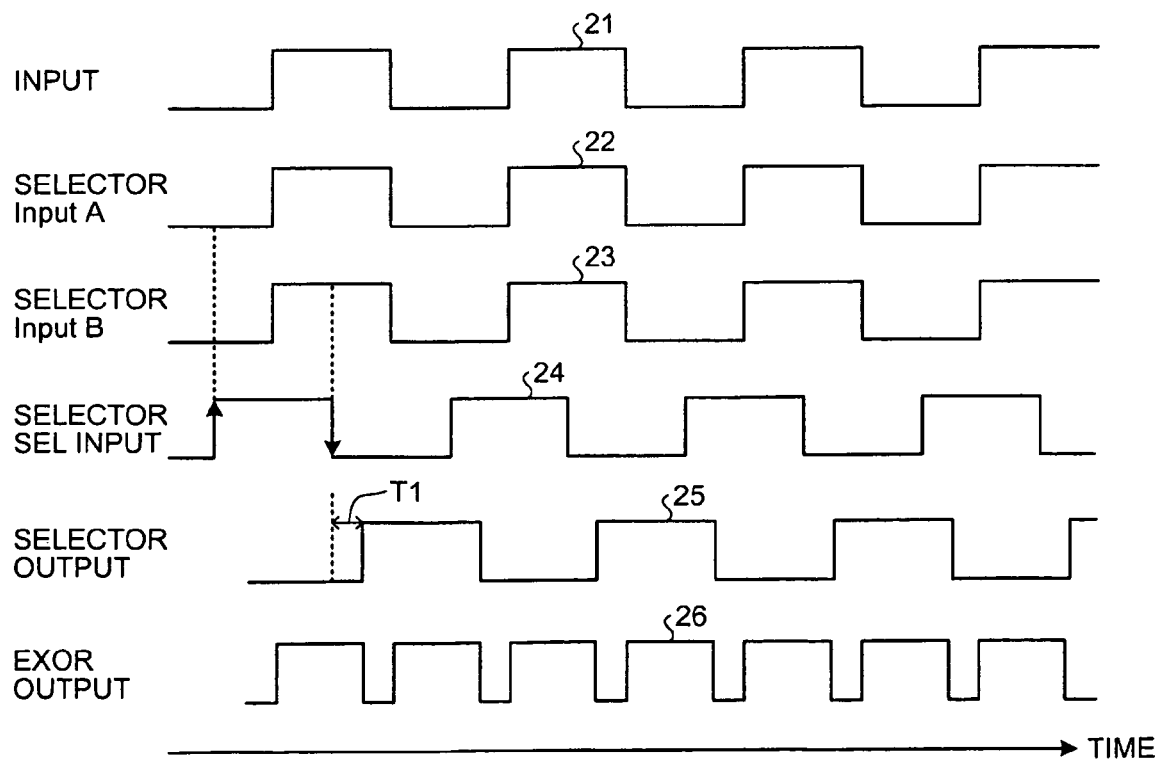
FIG. 2 is a waveform diagram of signals from units in the frequency doubler depicted in FIG. 1.

FIG. 2 is a waveform diagram of signals from units in the frequency doubler depicted in FIG. 1. In FIG. 2, the horizontal axis (time) represents a time axis common to waveforms 21 to 26. In FIG. 2, each of the signals from the units in the frequency doubler 10 is depicted as a square wave. The waveform 21 (INPUT) represents a clock signal input to the input unit 11.

The waveform 22 (selector InputA) represents the clock signal input to the InputA terminal of the selector 13. The waveform 23 (selector InputB) represents the clock signal input to the InputB terminal of the selector 13. As indicated by the waveforms 22 and 23, the clock signal input to the InputA terminal and the clock signal input to the InputB terminal are synchronized with each other.

The waveform 24 (selector SEL input) represents the clock signal input to the SEL terminal of the selector 13. The waveform 25 (selector output) represents the clock signal output from the selector 13 to the calculating circuit 14. As depicted in FIG. 2, the phase of the clock signal output from the selector 13 is delayed from an optimum point by a period t1.

The waveform 26 (EXOR output) represents the signal output from the calculating circuit 14 to the output unit 15. As indicated by the waveform 26, the calculating circuit 14 outputs the exclusive-OR of the clock signal input to and output from the input unit 11 (waveform 21) and the clock signal output from the selector 13 (waveform 25). Because the phase of the clock signal output from the selector 13 (waveform 25) is delayed from the optimum point, the duty cycle of the clock signal output from the calculating circuit 14 (waveform 26) becomes greater than 50%.

Figure 3:
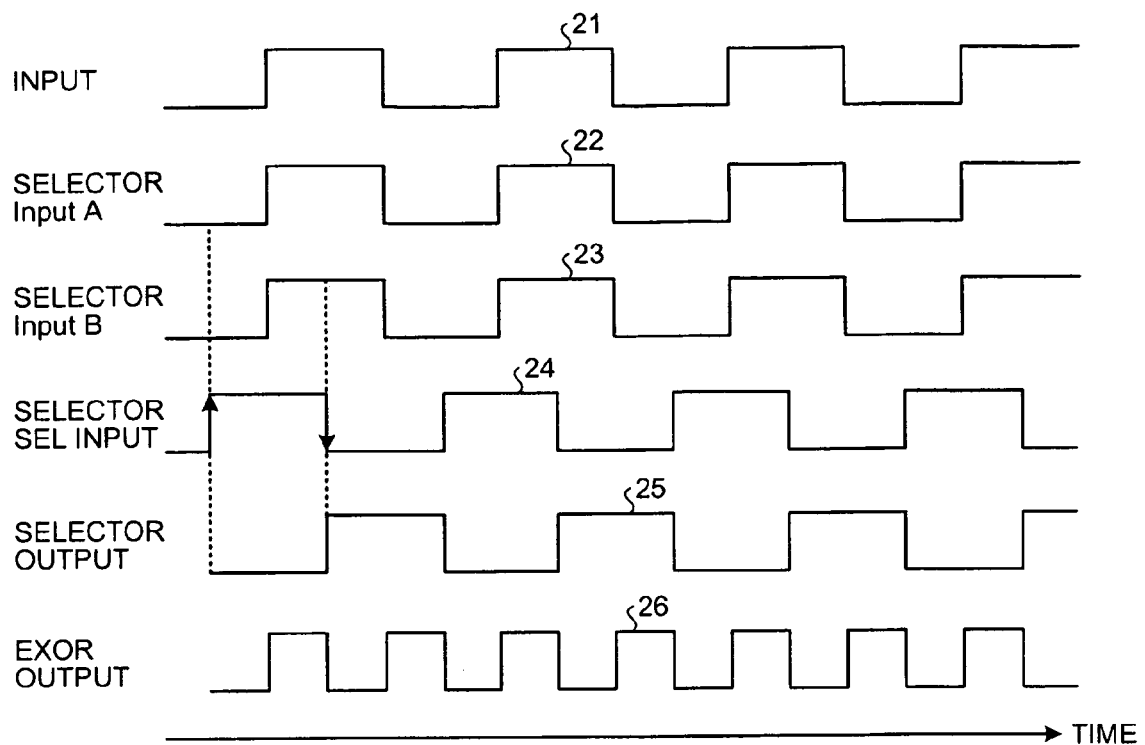
FIG. 3 is another waveform diagram of the signals from the units in the frequency doubler depicted in FIG. 1.

FIG. 3 is another waveform diagram of the signals from the units in the frequency doubler depicted in FIG. 1. In FIG. 3, constituent elements identical to those described in FIG. 2 are denoted by identical reference numerals, and are omitted in further description. The waveforms 21 to 24 depicted in FIG. 3 are identical to the waveforms 21 to 24 depicted in FIG. 2. In FIG. 3, however, the phase of the clock signal output from the selector 13 is at the optimum point. In this case, the duty cycle of the clock signal output from the calculating circuit 14 (waveform 26) is 50%.

Figure 4:
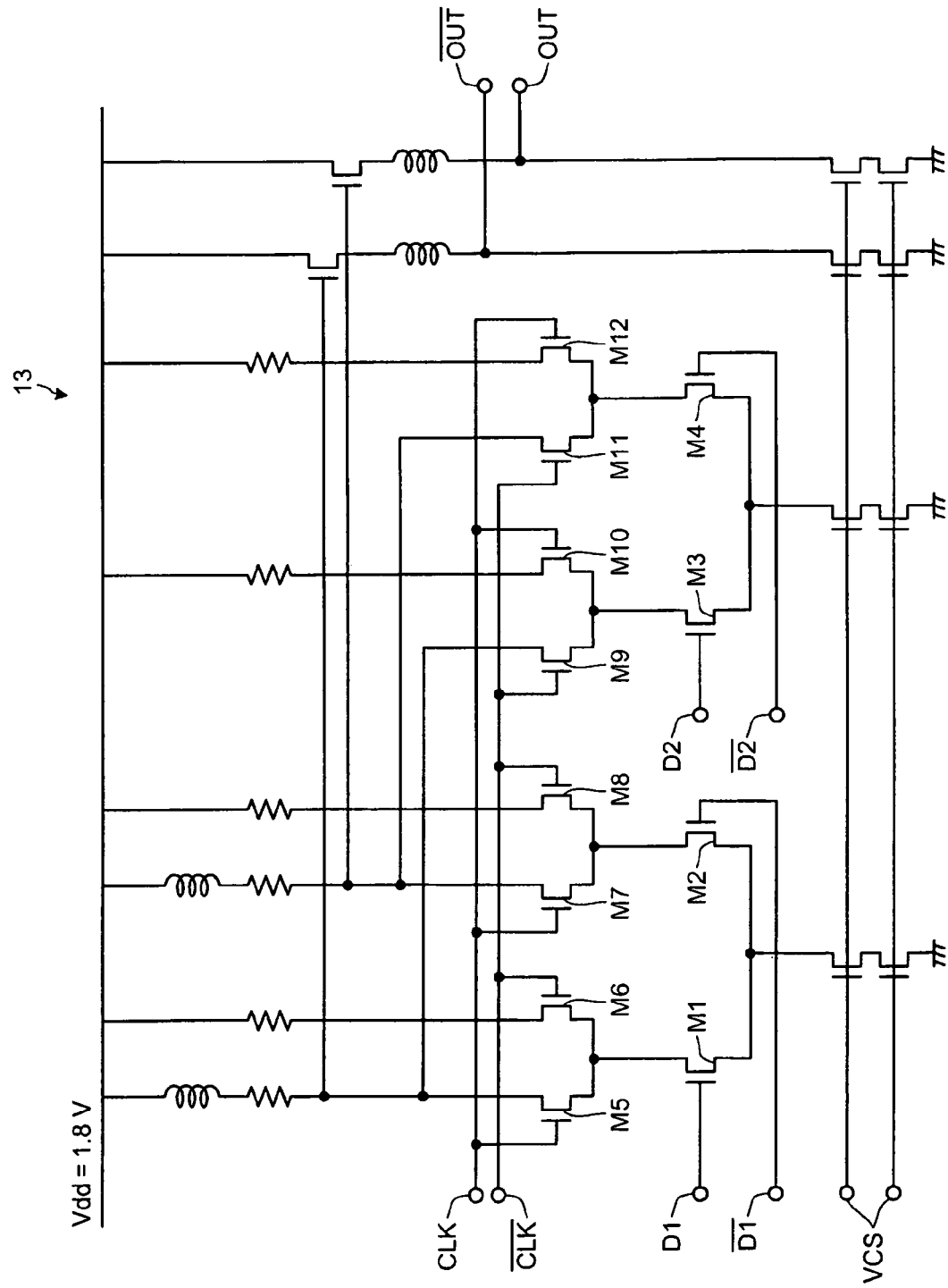
FIG. 4 is a circuit diagram of a detailed exemplary configuration of a selector depicted in FIG. 1.

FIG. 4 is a circuit diagram of a detailed exemplary configuration of the selector depicted in FIG. 1. Each circuit in the frequency doubler 10 depicted in FIG. 1 is a differential circuit. As depicted in FIG. 4, the selector 13 is a selector in an ordinary differential circuit (see, e.g., ISSCC2004 standard 13.4). Input terminals D1, D1-bar are equivalent to the InputA terminal of the selector 13 depicted in FIG. 1. Input terminals D2, D2-bar are equivalent to the InputB terminal of the selector 13 depicted in FIG. 1.

An input terminal CLK is equivalent to the SEL terminal of the selector 13 depicted in FIG. 1, and an input terminal CLK-bar is equivalent to the Ref terminal of the selector 13 depicted in FIG. 1. The input terminals CLK and CLK-bar thus serve as a differential input terminal for a clock signal in such a way that the input terminal CLK is used as the input terminal for a clock signal while the input terminal CLK-bar is used as the input terminal for a reference voltage. Input terminals OUT and OUT-bar are equivalent to an output terminal connected to the calculating circuit 14.

Figure 5:
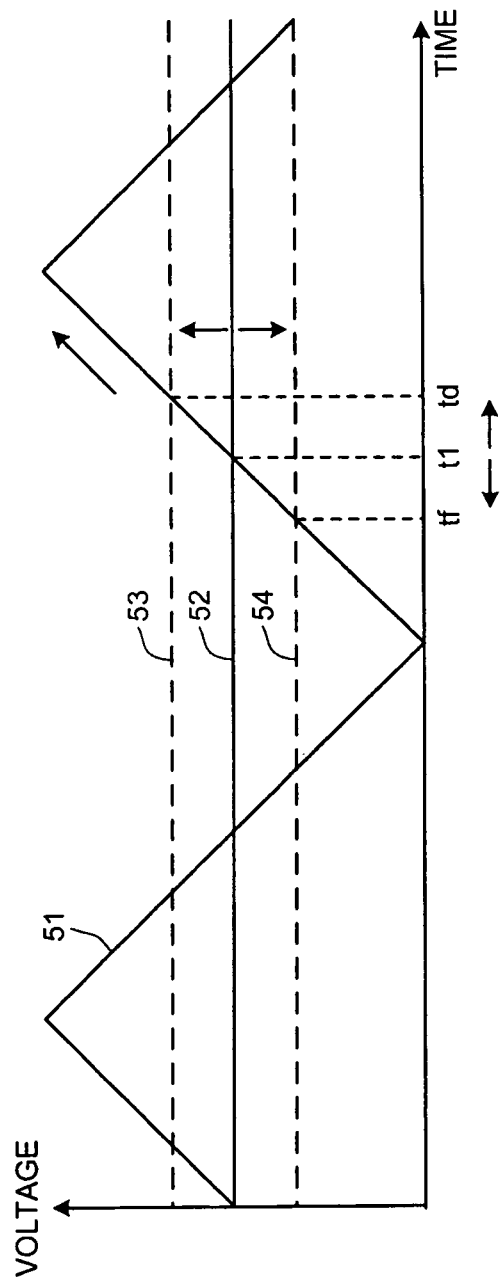
FIG. 5 is a schematic depicting the operation of the selector depicted in FIG. 1.

FIG. 5 depicts the operation of the selector depicted in FIG. 1. In FIG. 5, the horizontal axis represents time, and the vertical axis represents voltage. A clock signal 51 represents a clock signal input to the SEL terminal of the selector 13 (waveform 24 depicted in FIGS. 2 and 3). A reference voltage 52 represents a reference voltage supplied to the Ref terminal of the selector 13.

A time t1 represents a time at which the clock signal 51 shifts across the reference voltage 52 from a lower voltage to a higher voltage. A reference voltage 53 is a reference voltage that is higher than the reference voltage 52 and that is lower than the maximum voltage of the clock signal 51. When the reference voltage 53 is supplied from the supply unit 12 to the Ref terminal, the clock signal 51 shifts across the reference voltage 53 at a time td after the passage of the time t1.

A reference voltage 54 is a reference voltage that is lower than the reference voltage 52 and that is higher than the minimum voltage of the clock signal 51. When the reference voltage 54 is supplied from the supply unit 12 to the Ref terminal, the clock signal 51 shifts across the reference voltage 54 at a time tf before the arrival of the time t1. In this manner, changing the reference voltage supplied from the supply unit 12 to the Ref terminal of the selector 13 enables adjusting the timing at which the clock signal input to the SEL terminal shifts across the reference voltage.

Adjusting the timing at which the clock signal input to the SEL terminal shifts across the reference voltage enables adjusting the delay rate of a clock signal output from the selector 13 to the calculating circuit 14. Changing the reference voltage supplied from the supply unit 12 to the Ref terminal of the selector 13, therefore, enables adjusting the delay rate of the clock signal output from the selector 13 to the calculating circuit 14 relative to a clock signal output from the input unit 11 to the calculating unit 14.

In this manner, according to the frequency doubler 10 of the first embodiment, a delay difference between clock signals input to the calculating circuit 14 can be changed by retiming at the selector 13. Hence, the delay difference between the clock signals input to the calculating circuit 14 can be controlled precisely to the optimum point (e.g., T/4) by changing the reference voltage supplied to the selector 13. This enables precise control of the duty cycle of a clock signal even if fabrication variations and time-dependent changes of the circuit exist.

While the above configuration is described as a configuration in which discriminative phase adjustment for retiming at the selector 13 is performed through the reference voltage supplied to the Ref terminal of the selector 13, the configuration for performing the discriminative phase adjustment is not limited to the above configuration. For example, the discriminative phase adjustment can also be performed by controlling the delay rate of the clock signal input to the SEL terminal of the selector 13.

Figure 6:
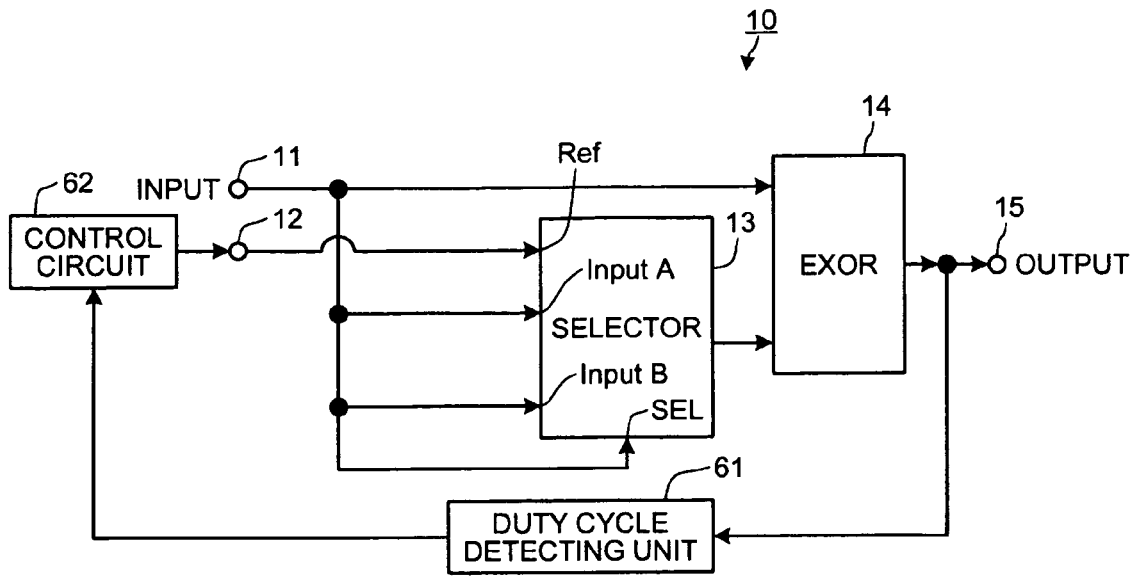
FIG. 6 is a circuit diagram of the frequency doubler according to a second embodiment.

FIG. 6 is a circuit diagram of the frequency doubler according to a second embodiment. In FIG. 6, constituent elements identical to those described in FIG. 1 are denoted by identical reference numerals, and are omitted in further description. As depicted in FIG. 6, the frequency doubler 10 according to the second embodiment includes a duty cycle detecting unit 61, and a control circuit 62, in addition to the constituent elements of the frequency doubler 10 depicted in FIG. 1.

The duty cycle detecting unit 61 detects the duty cycle of a clock signal output from the calculating unit 14, and outputs information indicative of the detected duty cycle to the control circuit 62. The control circuit 62 controls the reference voltage supplied from the supply unit 12 to the selector 13 so that the duty cycle indicated by the information output from the duty cycle detecting unit 61 becomes 50%.

Figure 7:
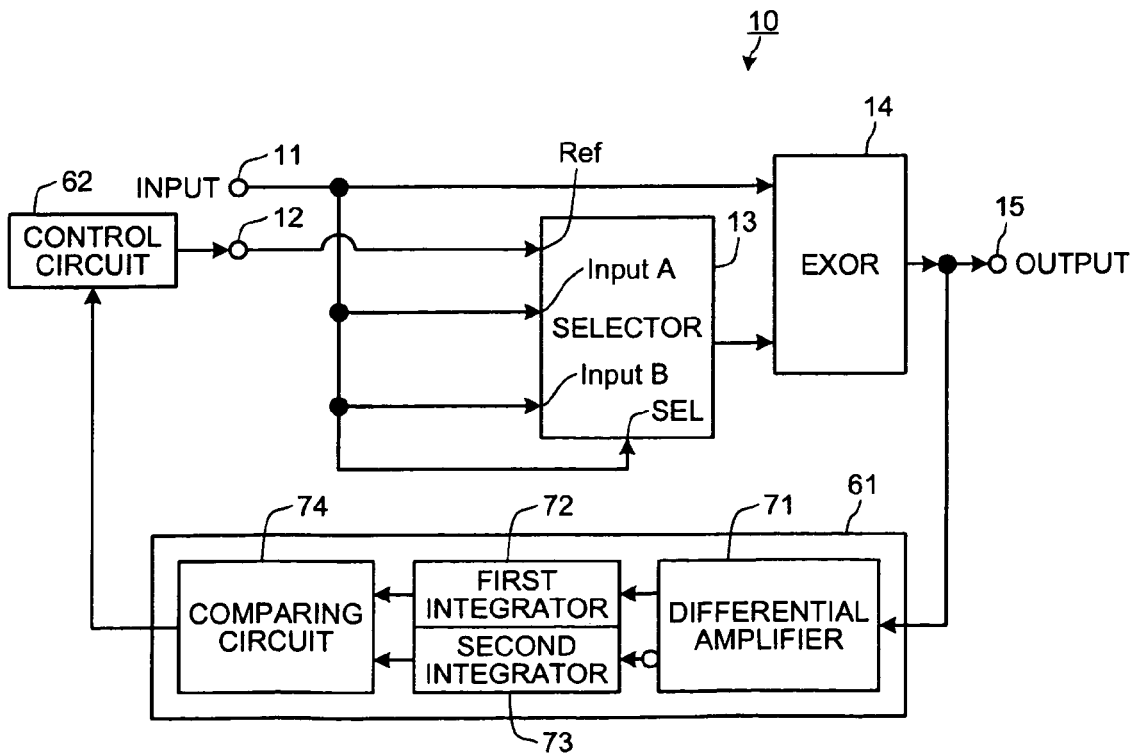
FIG. 7 is a circuit diagram of a detailed example of a duty cycle detecting unit of FIG. 6.

FIG. 7 is a circuit diagram of a detailed example of the duty cycle detecting unit of FIG. 6. In FIG. 7, constituent elements identical to those described in FIG. 6 are denoted by identical reference numerals, and are omitted in further description. As depicted in FIG. 7, the duty cycle detecting unit 61 includes a differential amplifier 71, a first integrator 72, a second integrator 73, and a comparing circuit 74.

The differential amplifier 71 differentially amplifies a clock signal output from the calculating circuit 14. The differential amplifier 71 outputs, as a positive signal to the first integrator 72, a non-inverted clock signal that is among the differentially amplified clock signals and further outputs, as an inverted signal to the second integrator 73, an inverted clock signal that is among the differentially amplified clock signals.

The first integrator 72 averages the positive signal output from the differential amplifier 71 and outputs the averaged positive signal to the comparing circuit 74. The second integrator 73 averages the inverted signal output from the differential amplifier 71 and outputs the averaged inverted signal to the comparing circuit 74. The comparing circuit 74 outputs, to the control circuit 62 as information indicative of the duty cycle of a clock signal, a difference between the signal output from the first integrator 72 and the signal output from the second integrator 73.

To control the duty cycle of the clock signal output from the calculating unit 14 to 50%, the control circuit 62 controls the reference voltage supplied from the supply unit 12 to the selector 13 so that the difference output from the comparing circuit 74 is minimized.

Figure 8:
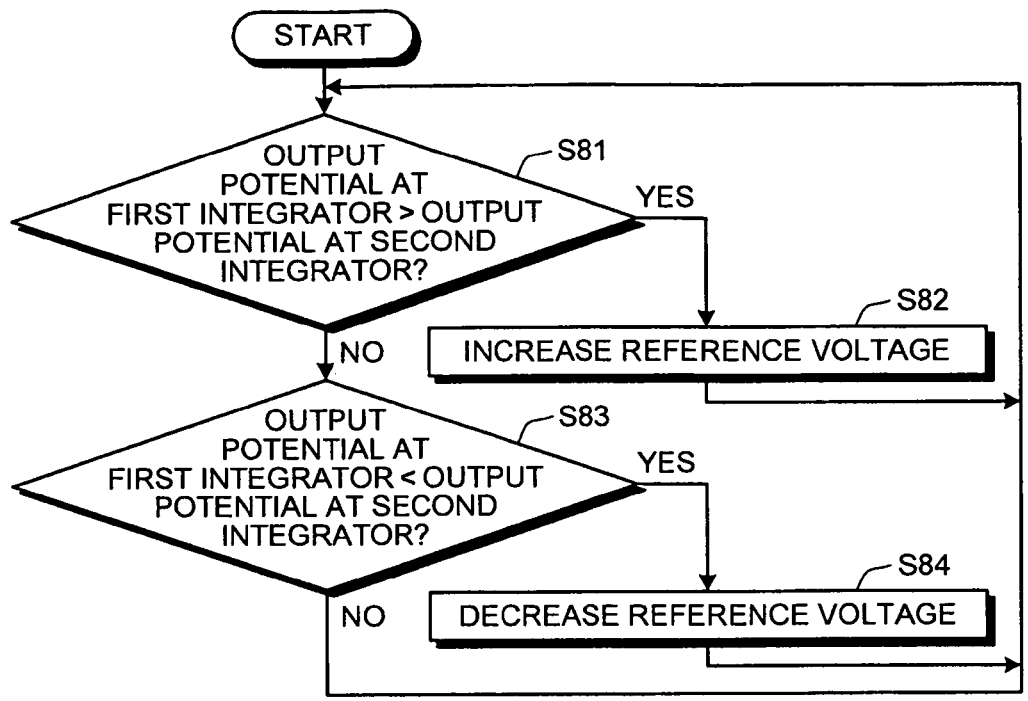
FIG. 8 is a flowchart of an example of the operation of the frequency doubler depicted in FIG. 7.

FIG. 8 is a flowchart of an example of the operation of the frequency doubler depicted in FIG. 7. As depicted in FIG. 8, whether an output potential at the first integrator 72 is higher than an output potential at the second integrator 73 is determined (step S81). When the output potential at the first integrator 72 is higher than the output potential at the second integrator 73 (step S81: YES), a reference voltage supplied from the supply unit 12 to the selector 13 is increased (step S82), and the process flow returns to step S81.

When the output potential at the first integrator 72 is not higher than the output potential at the second integrator 73 (step S81: NO), whether the output potential at the first integrator 72 is lower than the output potential at the second integrator 73 is determined (step S83). When the output potential at the first integrator 72 is lower than the output potential at the second integrator 73 (step S83: YES), the reference voltage supplied from the supply unit 12 to the selector 13 is decreased (step S84), and the process flow returns to step S81.

At step S83, when the output potential at the first integrator 72 is not lower than the output potential at the second integrator 73 (step S83: NO), the process flow returns to step S81, from which the process resumes. Through the steps above, the output potential at the first integrator 72 and the output potential at the second integrator 73 are controlled to become equivalent. As a result, the duty cycle of a clock signal output from the calculating circuit 14 is controlled to 50%.

Figure 9:
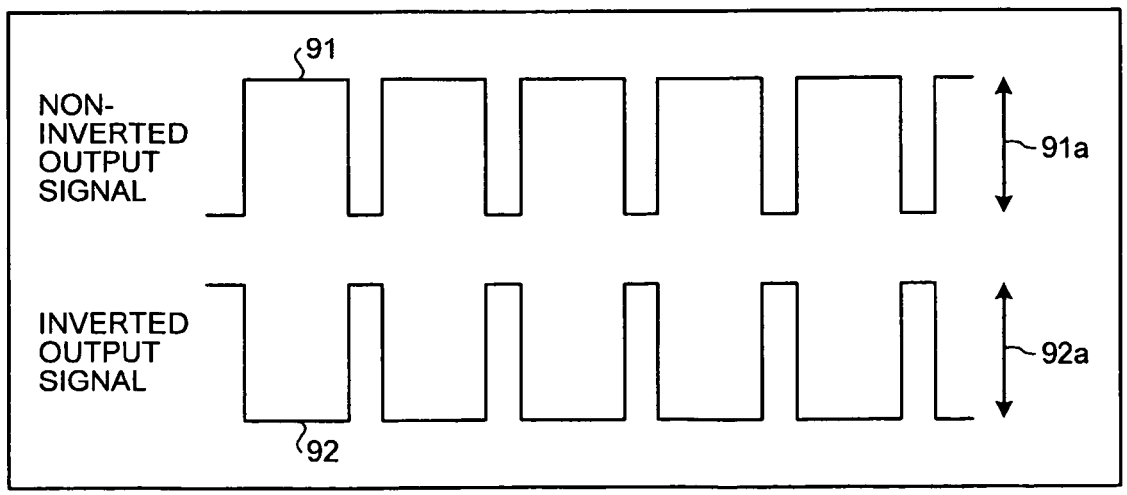
FIG. 9 is a diagram of signals output from a differential amplifier depicted in FIG. 7.

FIG. 9 is a diagram of signals output from the differential amplifier depicted in FIG. 7. FIG. 9 depicts a case in which the duty cycle of a clock signal output from the calculating circuit 14 is shifted from 50%. In FIG. 9, a positive output signal 91 represents a signal output from the differential amplifier 71 to the first integrator 72. Amplitude 91a represents the amplitude of the positive output signal 91.

An inverted output signal 92 represents a signal output from the differential amplifier 71 to the second integrator 73. Amplitude 92a represents the amplitude of the inverted output signal 92. As indicated by the positive output signal 91, the duty cycle of the clock signal output from the calculating circuit 14 is greater than 50%. Noise in the clock signal output from the calculating circuit 14 includes noise in the positive output signal 91 and inverses of the noise in the inverted output signal 92; hence, the noise and the inverses of the noise cancel out each other at the comparing circuit 74.

Figure 10:
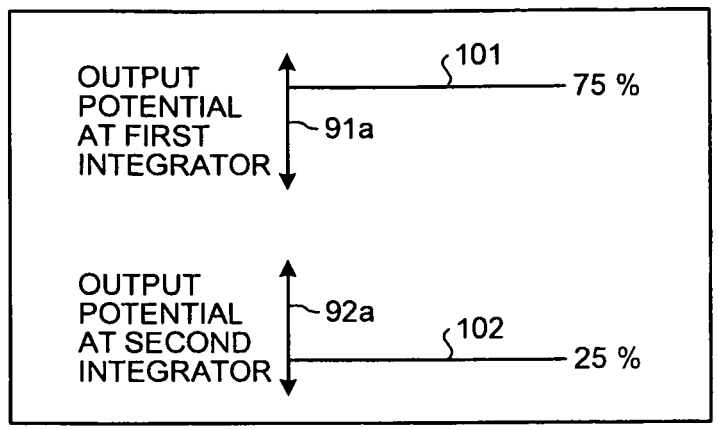
FIG. 10 is a schematic depicting signals that are in the state depicted in FIG. 9 and output from integrators.

FIG. 10 depicts signals that are in the state depicted in FIG. 9 and output from the integrators, respectively. In FIG. 10, amplitudes 91a and 92a are equivalent to the amplitudes 91a and 92a depicted in FIG. 9. An output potential 101 is the potential of an output signal from the first integrator 72, and an output potential 102 is the potential of an output signal from the second integrator 73.

Because the duty cycle of the output signal output from the differential amplifier 71 to the first integrator 72 is greater than 50% (see FIG. 9), the output potential 101 is a potential higher than the center of the amplitude 91a (e.g., duty cycle of 75%). In contrast, because the duty cycle of the output signal output from the differential amplifier 71 to the second integrator 73 is smaller than 50%, the output potential 102 is a potential lower than the center of the amplitude 92a (e.g., duty cycle of 25%).

In this state, because the output potential 101 is higher than the output potential 102, the reference voltage supplied from the supply unit 12 to the selector 13 is increased (step S81: YES in FIG. 8), thereby reducing the output potential 101 while increasing the output potential 102, i.e., the duty cycle of the clock signal output from the calculating circuit 104 approaches 50%.

Specifically, in this state, since the output potential 101 is higher than the output potential 102, the signal output from the comparing circuit 74 to the control circuit 62 has a positive potential. In response, the control circuit 62 increases the reference voltage to be supplied from the supply unit 12 to the selector 13 by an amount corresponding to the size of the potential of the signal output from the comparing circuit 74.

Figure 11:
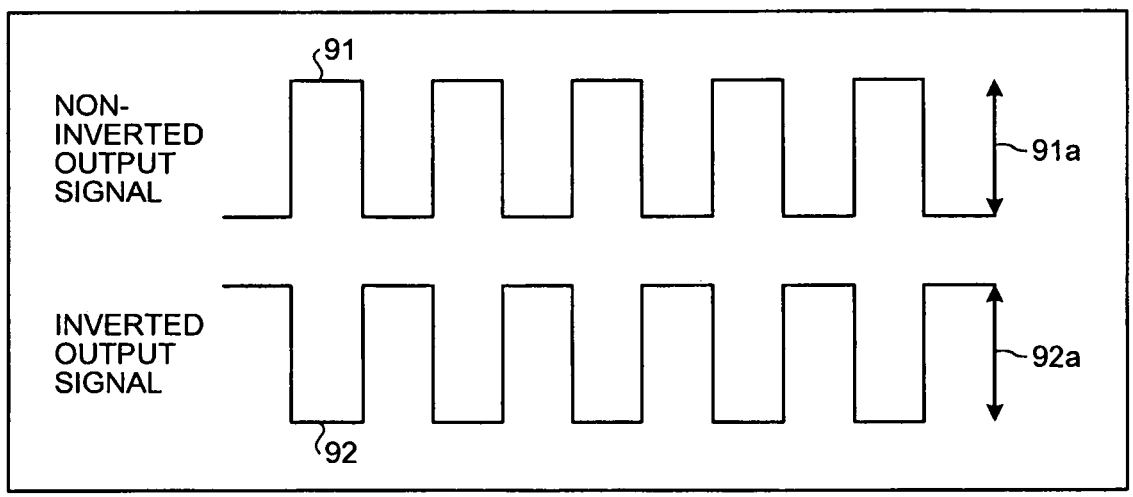
FIG. 11 is another diagram of the signals output from the differential amplifier depicted in FIG. 7.

FIG. 11 is another diagram of the signals output from the differential amplifier depicted in FIG. 7. In FIG. 11, constituent elements identical to those described in FIG. 9 are denoted by identical reference numerals, and are omitted in further description. In a case of FIG. 11, the duty cycle of the clock signal output from the calculating circuit 14 is 50%. As indicated by the positive output signal 91 and the inverted output signal 92, the duty cycle of each of the signals output from the differential amplifier 71 to the first and second integrators 72 and 73 is 50%.

Figure 12:
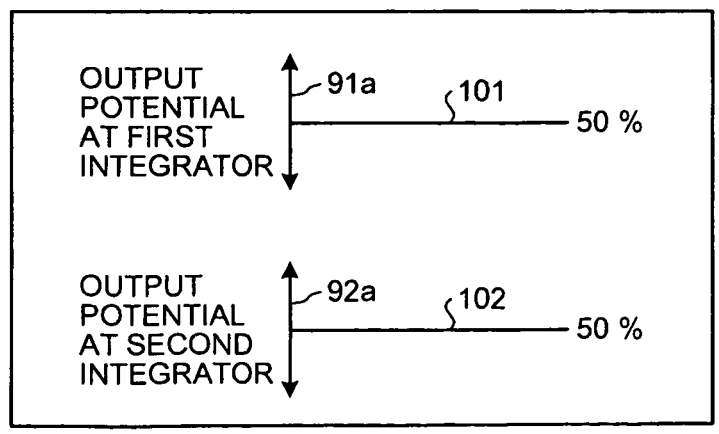
FIG. 12 is a schematic depicting signals that are in the state depicted in FIG. 11 and output from the integrators.

FIG. 12 depicts signals that are in the state depicted in FIG. 11 and output from the integrators, respectively. In FIG. 12, constituent elements identical to those described in FIG. 10 are denoted by identical reference numerals, and are omitted in further description. Because the duty cycle of the signal output from the differential amplifier 71 to the first integrator 72 is 50% (see FIG. 9), the output potential 101 is a potential at the center of the amplitude 91a and the output potential 102 is a potential at the center of the amplitude 92a (duty cycle of 50%).

In this state, because the output potential 101 is equivalent to the output potential 102, the signal output from the comparing circuit 74 to the control circuit 62 has zero potential. In response, the control circuit 62 maintains the reference voltage supplied from the supply unit 12 to the selector 13 as it is. As a result, the duty cycle of the clock signal output from the calculating circuit 14 is maintained at 50%.

Figure 13:
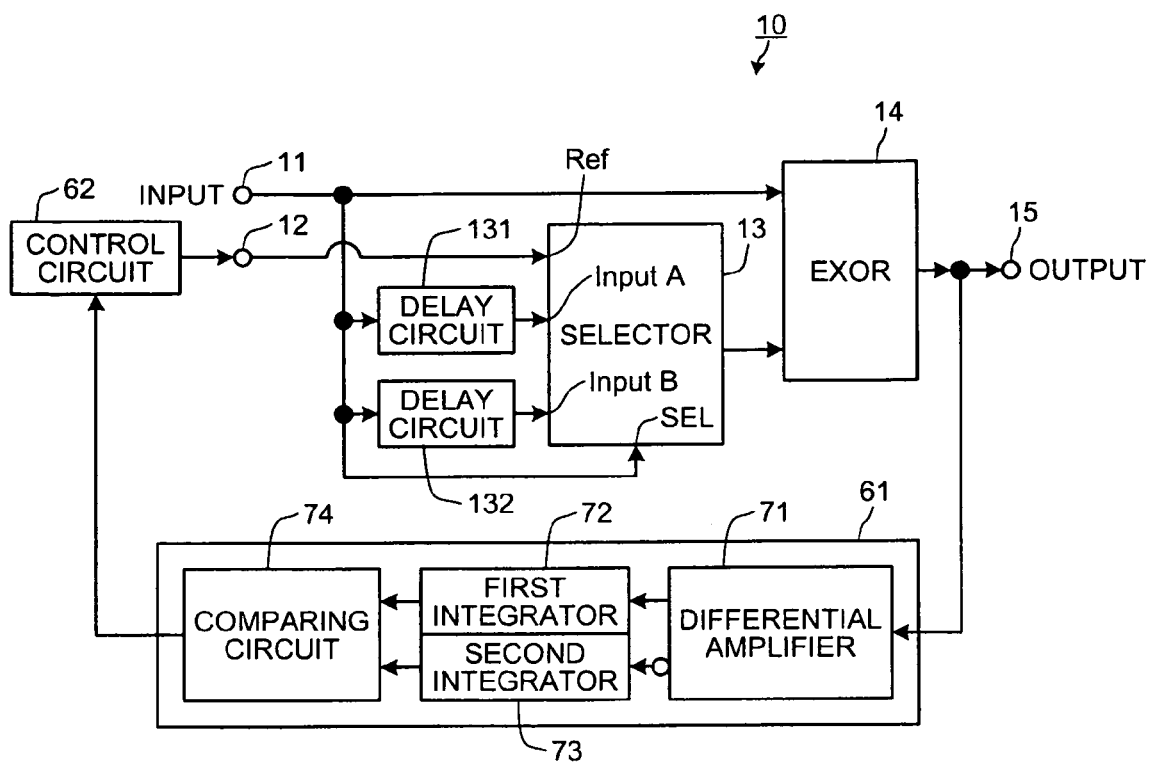
FIG. 13 is a schematic of a first modification of the frequency doubler depicted in FIG. 7.

FIG. 13 depicts a first modification of the frequency doubler depicted in FIG. 7. In FIG. 13, the constituent elements identical to those described in FIG. 7 are denoted by identical reference numerals, and are omitted in further description. As depicted in FIG. 13, the frequency doubler 10 may include a delay circuit 131, and a delay circuit 132, in addition to the constituent elements depicted in FIG. 7. The delay circuit 131 delays the clock signal output from the input unit 11 and outputs the delayed clock signal to the InputA terminal of the selector 13.

The delay circuit 132 delays the clock signal that is output from the input unit 11 and intended for input to the InputB terminal of the selector 13. The delay circuit 132 outputs the delayed clock signal to the selector 13. In the frequency doubler 10 described above, the clock signal input to the InputA terminal and the clock signal input to the InputB terminal are synchronized.

However, when the clock signals are not synchronized due to fabrication variation and/or a time-dependent change of a circuit, the delay rate at the delay circuit 131 and at the delay circuit 132 may be adjusted to synchronize the clock signal input to the InputA terminal and the clock signal input to the InputB terminal.

Figure 14:
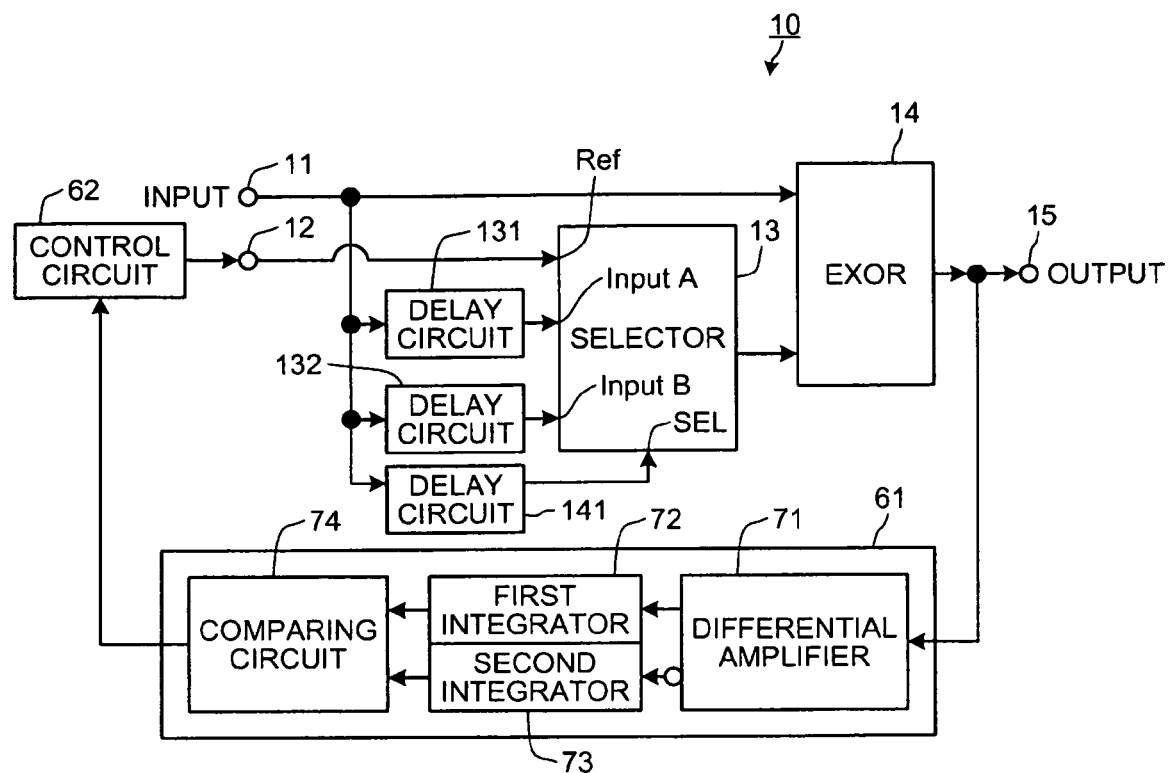
FIG. 14 is a schematic of a second modification of the frequency doubler of FIG. 7.

FIG. 14 depicts a second modification of the frequency doubler of FIG. 7. In FIG. 14, constituent elements identical to those described in FIG. 13 are denoted by identical reference numerals, and are omitted in further description. As depicted in FIG. 14, the frequency doubler 10 may include a delay circuit 141, in addition to the constituent elements depicted in FIG. 13. The delay circuit 141 delays the clock signal output from the input unit 11 and outputs the delayed clock signal to the SEL terminal of the selector 13.

For example, the clock signal input to the SEL terminal of the selector 13 is delayed by the delay rate of the delay circuit 141 such that the clock signal becomes delayed by T/4 relative to the clock signal output from the input unit 11 to the calculating circuit 14. As a result, the delay rate of the clock signal from the selector 13 is determined to be T/4 when no fabrication variation or time-dependent changes of a circuit exist.

In addition, a shift in the delay rate of a clock signal due to fabrication variation and/or a time-dependent change of a circuit is compensated by a change in the reference voltage supplied from the supply unit 12 to the Ref terminal of the selector 13. As a result, even if the range of a change in the reference voltage supplied to the Ref terminal of the selector 13 is small, the duty cycle of the clock signal output from the calculating circuit 14 can be controlled to 50%.

Figure 15:
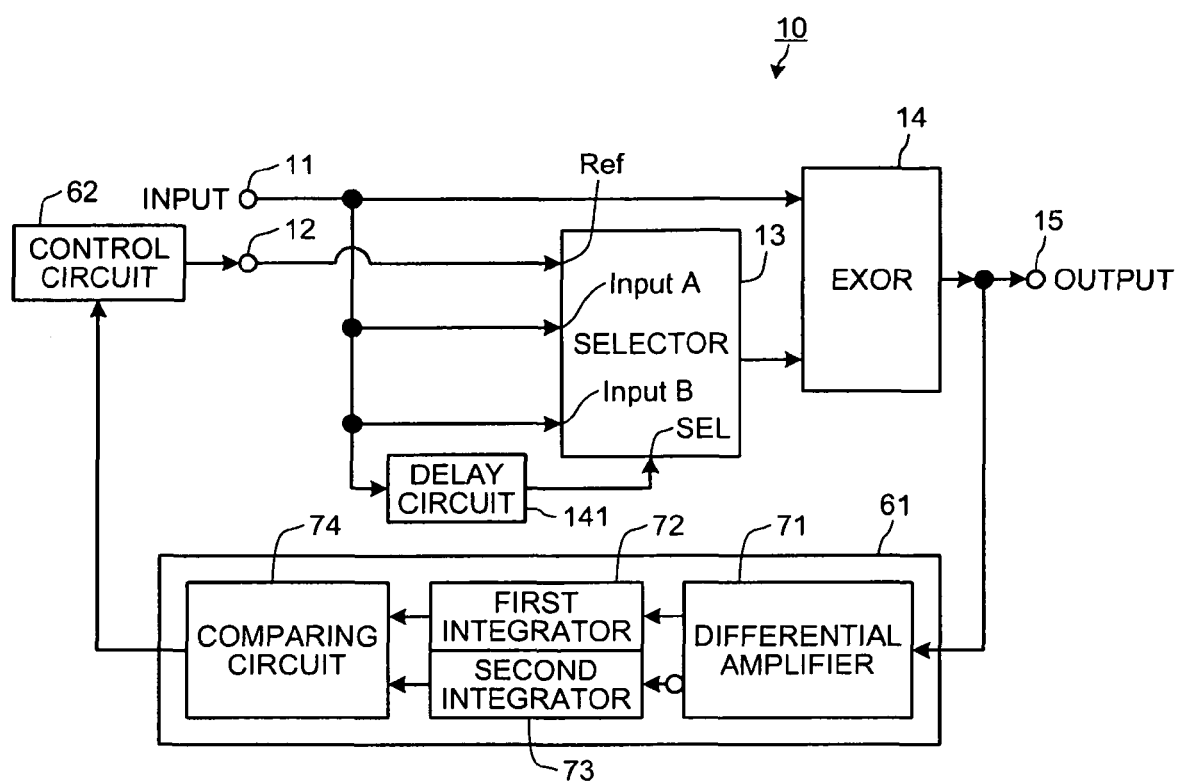
FIG. 15 is a schematic of a third modification of the frequency doubler depicted in FIG. 7.

FIG. 15 depicts a third modification of the frequency doubler depicted in FIG. 7. In FIG. 15, the constituent elements identical to those described in FIG. 14 are denoted by identical reference numerals, and are omitted in further description. As depicted in FIG. 15, the frequency doubler 10 may have the configuration depicted in FIG. 14 less the delay circuits 131 and 132. In this case, the clock signal input to the SEL terminal of the selector 13 is delayed by the delay rate of the delay circuit 141 such that the clock signal becomes delayed by T/4 relative to a clock signal output from the input unit 11 to the calculating circuit 14.

The delay circuit 141 may be disposed between the input unit 11 and the calculating unit 14, instead of being disposed between the input unit 11 and the selector 13. The delay circuit 141 is, therefore, disposed at least between the input unit 11 and the selector 13 or between the input unit 11 and the calculating unit 14. The delay circuit 141 is an adjusting means that adjusts the delay difference between the clock signal output from the input unit 11 to the calculating circuit 14 and the clock signal output from the input unit 11 to the SEL terminal of the selector 13, to one-fourth of the period of the clock signal (T/4).

Figure 16:
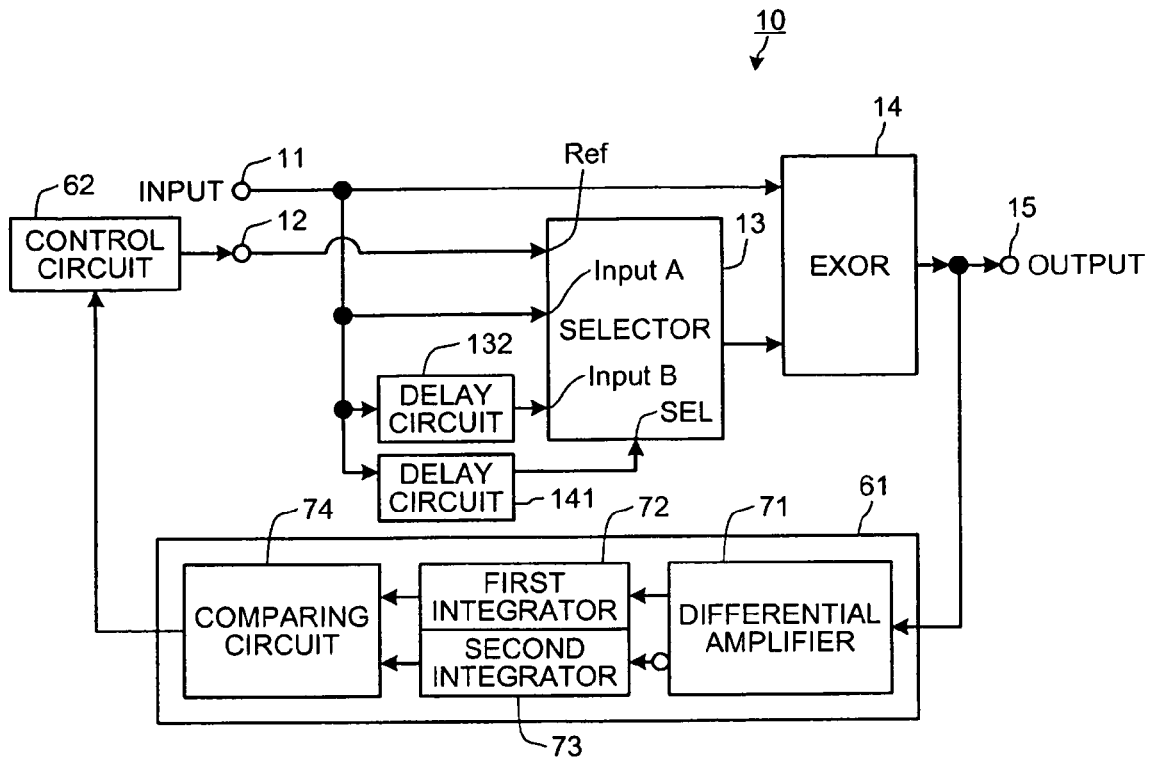
FIG. 16 is a schematic of a fourth modification of the frequency doubler of FIG. 7.

FIG. 16 depicts a fourth modification of the frequency doubler of FIG. 7. In FIG. 16, constituent elements identical to those described in FIG. 14 are denoted by identical reference numerals, and are omitted in further description. As depicted in FIG. 16, the frequency doubler 10 may have the configuration depicted in FIG. 14 less the delay circuit 131. In this case, the delay rate at the delay circuit 131 is adjusted to synchronize the clock signal input to the InputA terminal of the selector 13 and the clock signal input to the InputB terminal of the selector 13.

As described above, the frequency doubler 10 according to the second embodiment provides an effect identical to that provided by the frequency doubler 10 according to the first embodiment. According to the frequency doubler 10 of the second embodiment, the duty cycle of a clock signal output from the calculating circuit 14 is detected, and the reference voltage supplied from the supply unit 12 to the Ref terminal of the selector 13 is controlled based on the detected duty cycle. Thus, the duty cycle of the clock signal output from the calculating circuit 14 can be controlled automatically.

In detecting the duty cycle of a clock signal, the clock signal is amplified differentially to compare a positive output signal with an inverted output signal, and consequently, the noise in the clock signals cancel out each other, thereby enabling the duty cycle to be detected. The duty cycle of the clock signal is thus detected precisely to enable precise control over the duty cycle of the clock signal.

Figure 17:
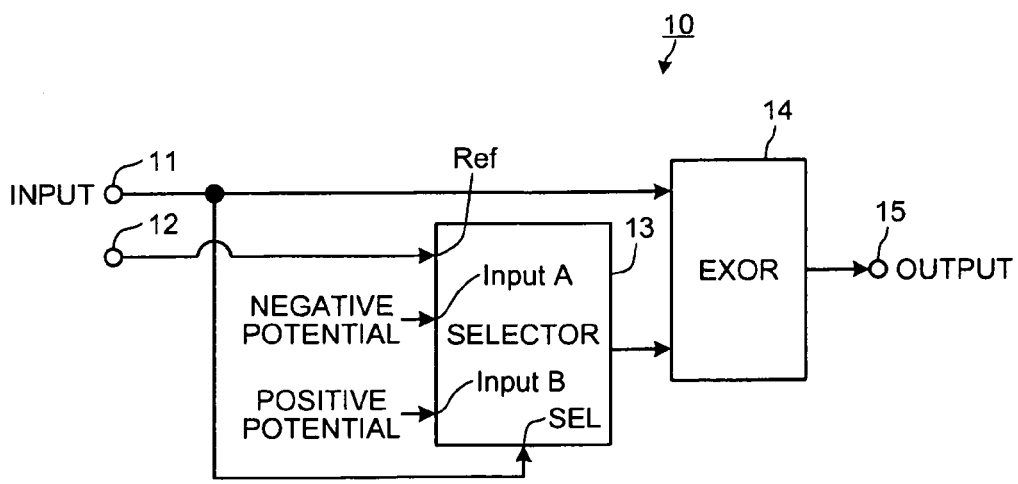
FIG. 17 is a circuit diagram of the frequency doubler according to a third embodiment.

FIG. 17 is a circuit diagram of the frequency doubler according to a third embodiment. In FIG. 17, constituent elements identical to those described in FIG. 1 are denoted by identical reference numerals, and are omitted in further description. As depicted in FIG. 17, in the frequency doubler 10 according to the third embodiment, a voltage (negative potential) on the negative potential side (low side) is applied constantly to the InputA terminal of the selector 13, and a voltage (positive potential) on the positive potential side (high side) is applied constantly to the InputB. The selector 13 alternately switches voltages corresponding to a positive potential side voltage and a negative potential side voltage for each other to output a voltage.

Figure 18:
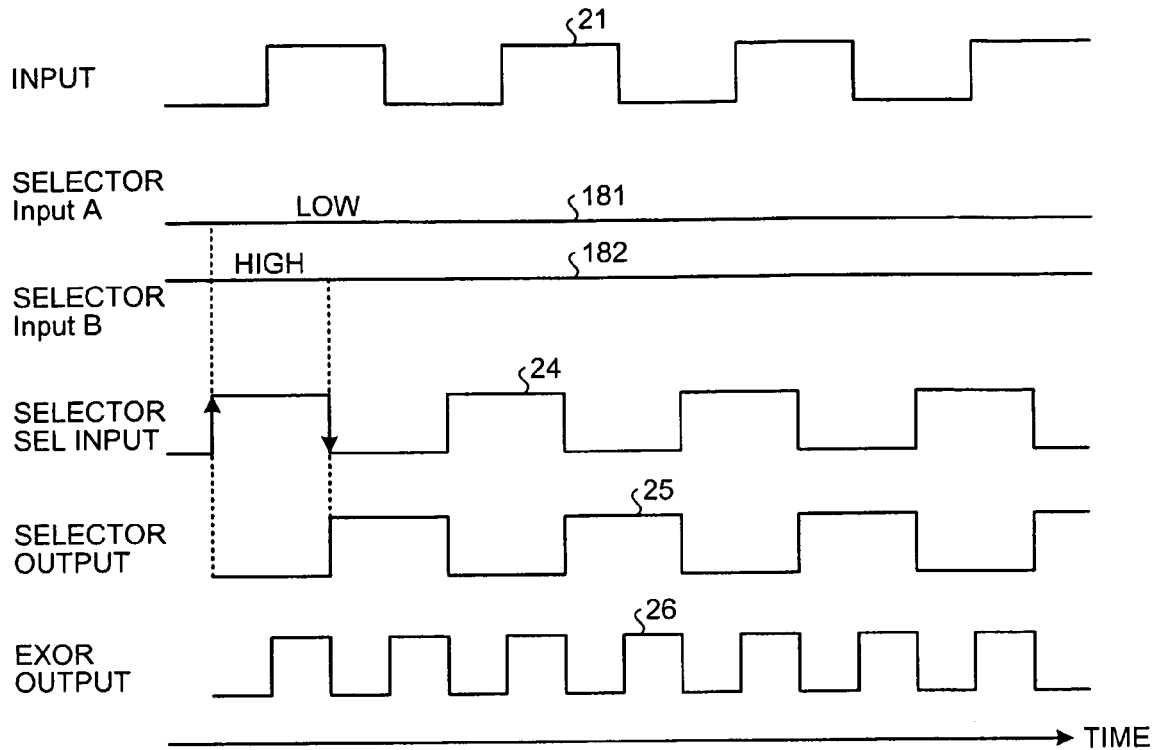
FIG. 18 is a waveform diagram of signals from units in the frequency doubler depicted in FIG. 17.

FIG. 18 is a waveform diagram of signals from units in the frequency doubler depicted in FIG. 17. In FIG. 18, constituent elements identical to those described in FIG. 3 are denoted by identical reference numerals, and are omitted in further description. In FIG. 18, a waveform 181 (selector InputA) represents a negative side voltage (low) applied to the InputA terminal of the selector 13. A waveform 182 (selector InputB) represents a positive side voltage (high) applied to the InputB terminal of the selector 13.

When the negative potential side voltage is applied constantly to the InputA terminal of the selector 13 and the positive potential side voltage is applied constantly to the InputB, the clock signal output from the selector 13 to the calculating circuit 14 (waveform 25) and the clock signal output from the calculating circuit 14 to the output unit 15 (waveform 26) become identical to the corresponding signals (waveforms 25 and 26) depicted in FIG. 3. As a result, the frequency doubler 10 can output, from the output unit 15, a clock signal having a frequency two times the frequency of a clock signal input through the input unit 11.

Figure 19:
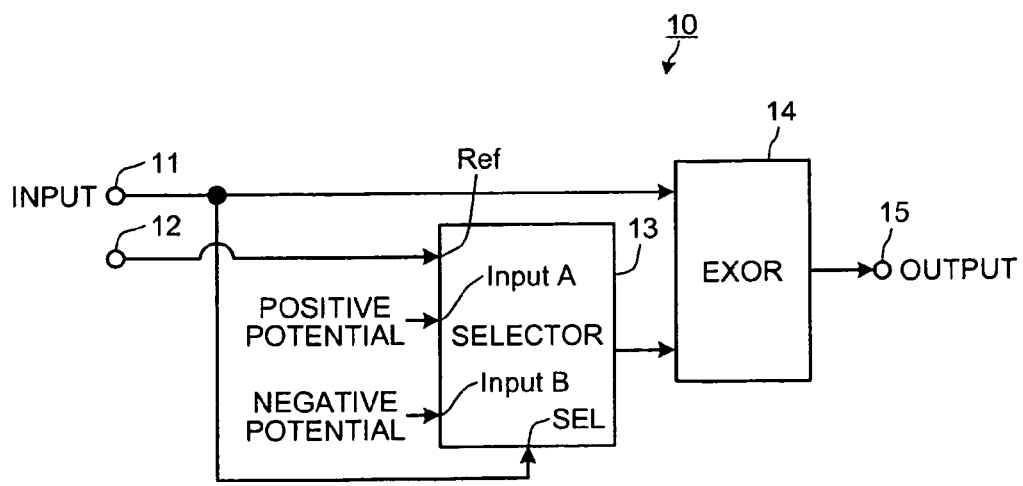
FIG. 19 is a circuit diagram of a modification of the frequency doubler depicted in FIG. 17.

FIG. 19 is a circuit diagram of a modification of the frequency doubler depicted in FIG. 17. In FIG. 19, constituent elements identical to those described in FIG. 17 are denoted by identical reference numerals, and are omitted in further description. As depicted in FIG. 19, in the frequency doubler 10 according to the third embodiment, a positive potential side voltage may be applied constantly to the InputA terminal of the selector 13 and a negative potential side voltage may be applied constantly to the InputB terminal.

In this case, the clock signal output from the selector 13 to the calculating unit 14 is an inverted signal that is an inversion of the clock signal depicted as the waveform 25 in FIG. 18. In other words, the clock signal output from the selector 13 to the calculating unit 14 differs in delay rate from the clock signal depicted as the waveform 25 in FIG. 18 by T/2. In this case, the frequency doubler 10 can output, from the output unit 15, a clock signal having a frequency two times the frequency of the clock signal input through the input unit 11.

According to the frequency doubler 10 of the third embodiment, in an identical manner to that in the frequency doubler 10 of the first embodiment, the reference voltage supplied to the selector 13 is changed to precisely control a delay difference between clock signals to an optimum point (e.g., T/4). The duty cycle of the clock signal, therefore, can be controlled precisely even if fabrication variation and/or a time-dependent change of a circuit exist.

The frequency doubler 10 according to the third embodiment may be provided with the duty cycle detecting unit 61 and the control circuit 62 depicted in FIG. 6. In this case, in an identical manner to that in the frequency doubler 10 of the second embodiment, the duty cycle of a clock signal output from the calculating circuit 14 can be controlled automatically. In addition, the duty cycle of the clock signal is detected precisely to precisely control the duty cycle of the clock signal.

Figure 20:
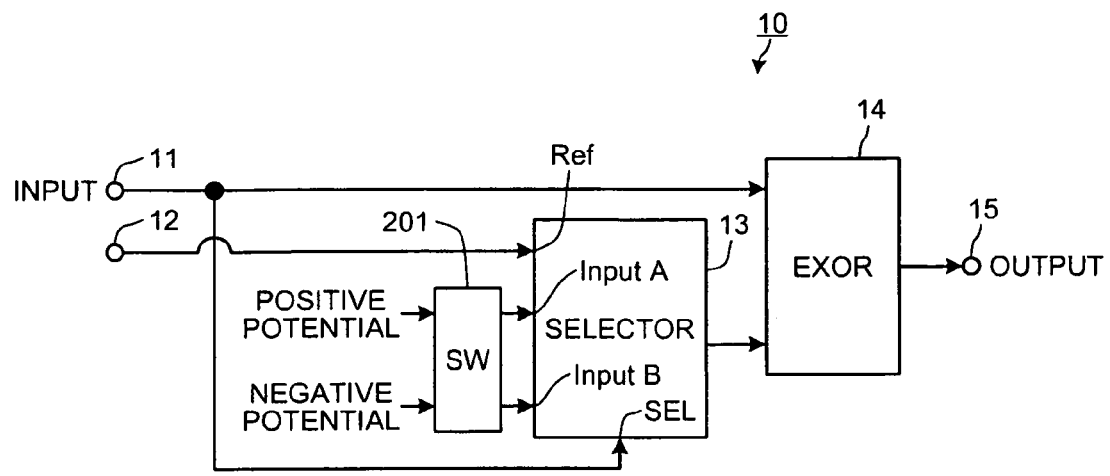
FIG. 20 is a circuit diagram of the frequency doubler according to a fourth embodiment.

FIG. 20 is a circuit diagram of the frequency doubler according to a fourth embodiment. In FIG. 20, constituent elements identical to those described in FIG. 1 are denoted by identical reference numerals, and are omitted in further description. As depicted in FIG. 20, the frequency doubler 10 according to the fourth embodiment includes a switch 201 (SW), in addition to the constituent elements depicted in FIG. 1. A positive potential side voltage and a negative potential side voltage are applied constantly to the switch 201, which outputs the positive potential side voltage and the negative potential side voltage to the InputA terminal and the InputB terminal of the selector 13, respectively.

Further, the switch 201 switches the positive potential side voltage and the negative potential side voltage to be applied to the selector 13. Specifically, the switch 201 interchanges a path that inputs the negative potential side voltage to the InputA of the selector 13 and inputs the positive potential side voltage to the InputB of the selector 13 and a path that inputs the positive potential side voltage to the InputA of the selector 13 and inputs the negative potential side voltage to the InputB of the selector 13.

Figure 21:
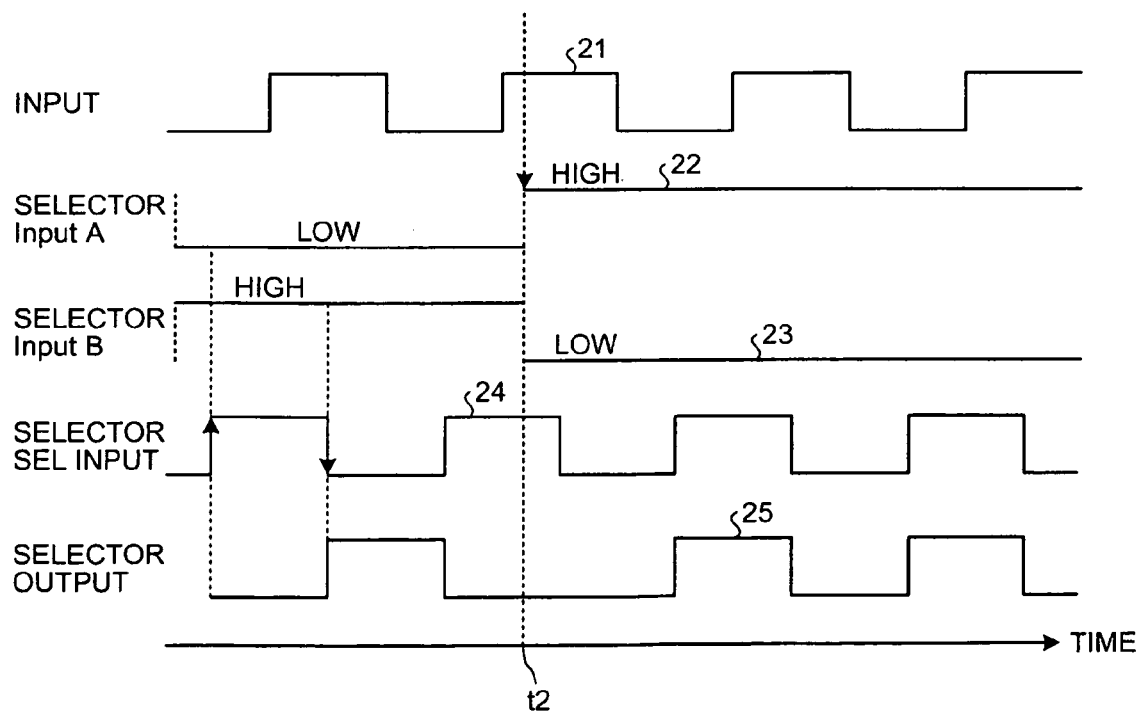
FIG. 21 is a waveform diagram of signals from units in the frequency doubler depicted in FIG. 20.

FIG. 21 is a waveform diagram of signals from units in the frequency doubler depicted in FIG. 20. In FIG. 21, constituent elements identical to those described in FIG. 18 are denoted by identical reference numerals, and are omitted in further description. A time t2 represents a time at which the switch 201 switches the path that inputs the negative potential side voltage to the InputA of the selector 13 and inputs the positive potential side voltage to the InputB of the selector 13, over to the path that inputs the positive potential side voltage to the InputA of the selector 13 and inputs the negative potential side voltage to the InputB of the selector 13.

During a period before the time t2, the frequency doubler 10 of the fourth embodiment operates identically to the frequency doubler 10 depicted in FIG. 17. During a period after the time t2, the frequency doubler 10 of the fourth embodiment operates identically to the frequency doubler 10 depicted in FIG. 19. Hence, path switching by the switch 201 enables switching between the inverted state and the non-inverted state of a clock signal output from the selector 13 to the calculating circuit 14.

When the state of the clock signal output to the calculating circuit 14 is switched (to inverted state or non-inverted state), the delay rate of the clock signal output from the selector 13 to the calculating circuit 14 is changed by T/2 relative to the clock signal output from the input unit 11 to the calculating circuit 14. Thus, the delay rate of the clock signal output from the selector 13 to the calculating circuit 14 relative to the clock signal output from the input unit 11 to the calculating circuit 14 is controlled by the reference voltage supplied to the Ref terminal of the selector 13, and can also be controlled through the switching operation by the switch 201.

The frequency doubler 10 of the fourth embodiment provides the effect provided by the frequency doubler 10 of the first embodiment. According to the frequency doubler 10 of the fourth embodiment, the state of the clock signal output to the calculating circuit 14 can be switched between the inverted state and non-inverted state through path switching by the switch 201, thereby enabling a sufficient increase in the variation of the delay rate of the clock signal output from the selector 13 to the calculating circuit 14 relative to the clock signal output from the input unit 11 to the calculating circuit 14.

Figure 22:
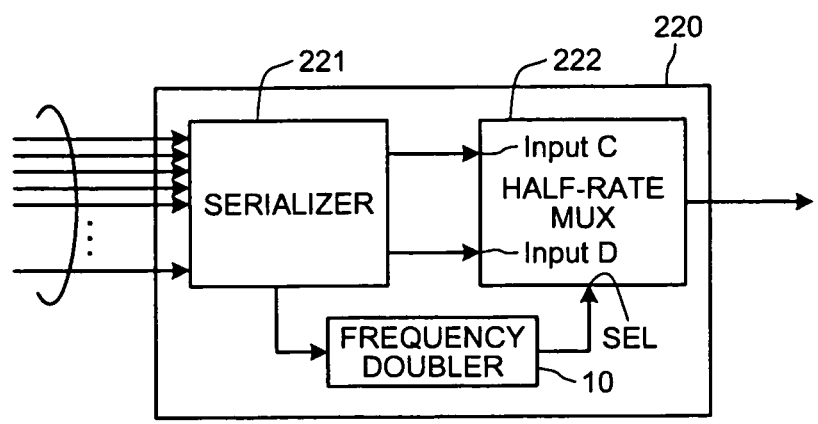
FIG. 22 is a block diagram of the signal generator according to a fifth embodiment.

FIG. 22 is a block diagram of the signal generator according to a fifth embodiment. A signal generator 220 according to the fifth embodiment is a serial signal generator that generates a serial signal from parallel signals input thereto and outputs the generated serial signal. The signal generator 220 includes a serializer 221, the frequency doubler 10, and a half-rate MUX 222.

Parallel signals are input to the serializer 221 as parallel signals of N/n Gb/s having n channels. The serializer 221 converts the input parallel signals into parallel signals of N/2 Gb/s having 2 channels.

The serializer 221 outputs one of the parallel signals of N/2 Gb/s having 2 channels (signal of N/2 Gb/s) to an InputC terminal of the half-rate MUX 222, and outputs another of the parallel signals of N/2 Gb/s having 2 channels (signal of N/2 Gb/s) to an InputD terminal of the half-rate MUX 222. The serializer 221 further outputs a clock signal of N/4 GHz to the frequency doubler 10.

The frequency doubler 10 is any one of the above frequency doublers 10. Based on the clock signal of N/4 GHz output from the serializer 221, the frequency doubler 10 outputs a clock signal having a frequency of N/2 GHz that is two times the clock signal frequency of N/4 GHz to the half-rate MUX 222, which is a multiplexing unit that time division multiplexes the plural signals output from the serializer 221 according to the timing of the clock signal output from the frequency doubler 10.

Specifically, the half-rate MUX 222 outputs a signal input to the InputC terminal during a period between a rising edge and a falling edge of the clock signal output from the frequency doubler 10, and outputs a signal input to the InputD terminal during a period between a falling edge and a rising edge of the clock signal output from the frequency doubler 10.

As a result, the signal input to the InputC terminal of the half-rate MUX 222 and the signal input to the InputD terminal are time division multiplexed and output to an external destination from the half-rate MUX 222. A signal output from the half-rate MUX 222 is a signal of N Gb/s.

Figure 23:
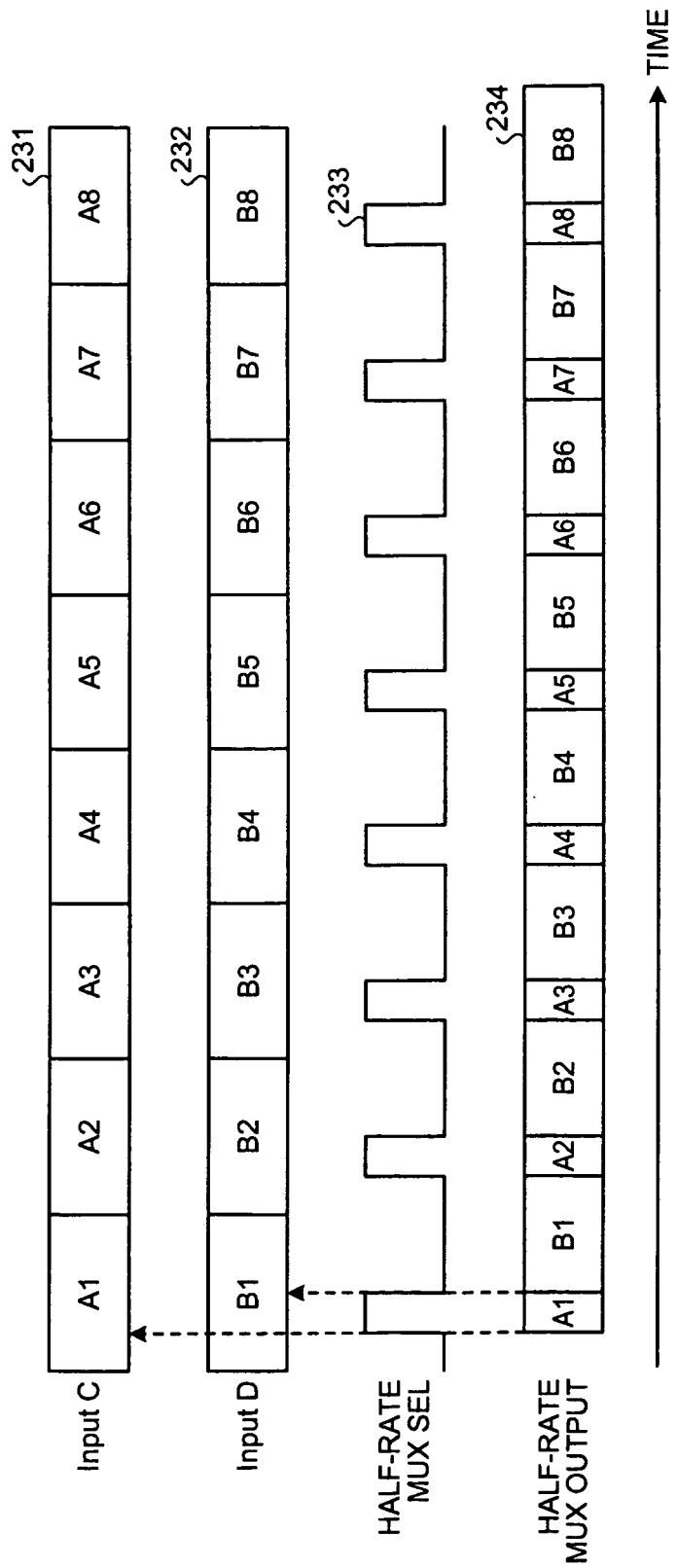
FIG. 23 is a diagram of signals from units in the signal generator depicted in FIG. 22.

FIG. 23 is a diagram of signals from units in the signal generator depicted in FIG. 22. In FIG. 23, the horizontal axis (time) represents a time axis common to signals 231 to 234. The signal 231 (InputC) represents each signal input to the InputC terminal of the half-rate MUX 222 (A1 to A8). The signal 232 (InputD) represents each signal input to the InputD terminal of the half-rate MUX 222 (B1 to B8).

The signal 233 (half-rate MUX SEL) represents a clock signal input to a SEL terminal of the half-rate MUX 222. In the case depicted in FIG. 23, the duty cycle of the clock signal output from the frequency doubler 10 to the SEL terminal of the half-rate MUX 222 is less than 50% (approximately 25%). The signal 234 (half-rate MUX output) represents a signal output from the half-rate MUX 222 to an external destination.

As indicated by the signal 234, the half-rate MUX 222 outputs the signal input to the InputC terminal (A1 to A8) during a period between a rising edge and a falling edge of the clock signal (signal 232), and outputs the signal input to the InputD terminal (B1 to B8) during a period between a falling edge and a rising edge of the clock signal (signal 232).

In this case, because the duty cycle of the clock signal output from the frequency doubler 10 to the SEL terminal of the half-rate MUX 222 is less than 50%, the period during which the signal input to the InputC terminal (A1 to A8) is output becomes shorter, while the period during which the signal input to the InputD terminal (B1 to B8) is output becomes longer, thereby making discrimination of each signal at the reception side difficult.

Figure 24:
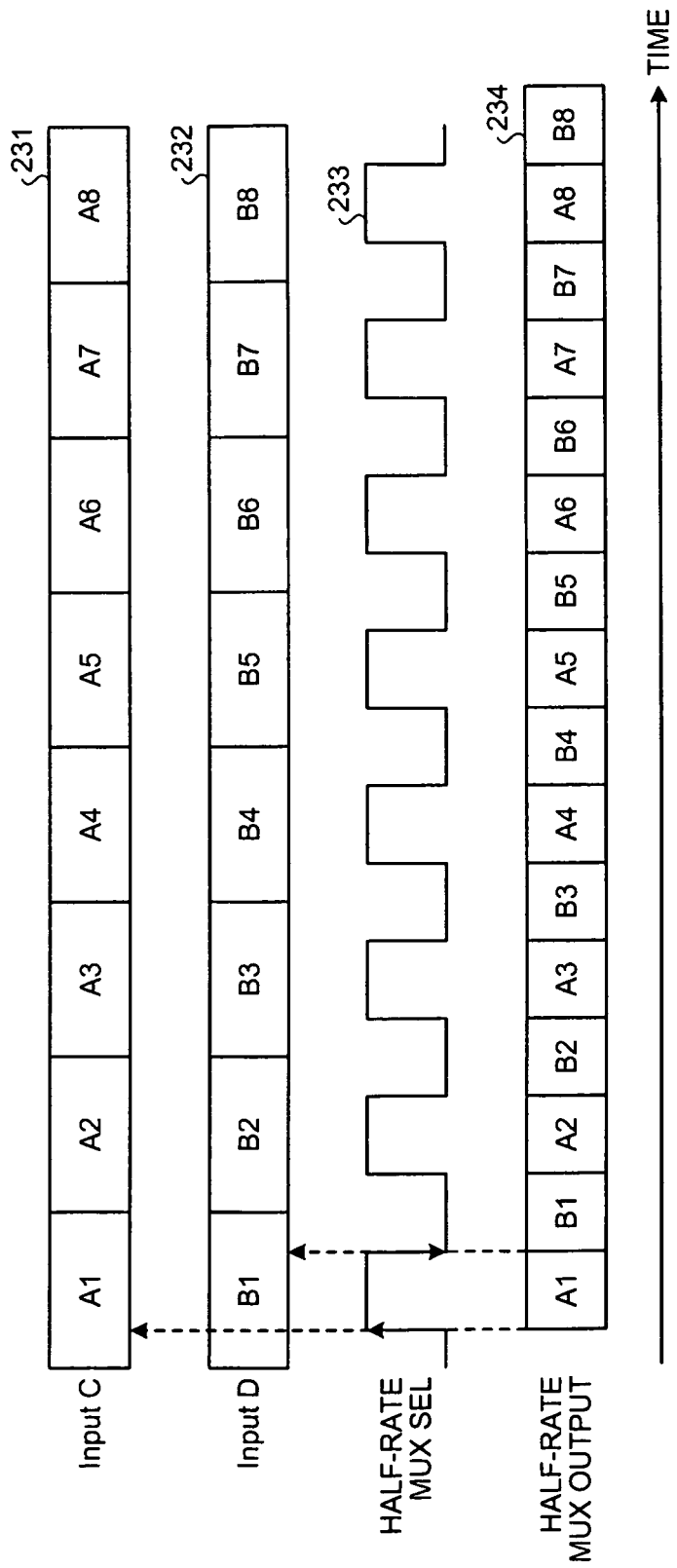
FIG. 24 is another diagram of the signals from the units in the signal generator depicted in FIG. 22.

FIG. 24 is another diagram of the signals from the units in the signal generator depicted in FIG. 22. In FIG. 24, constituent elements identical to those described in FIG. 23 are denoted by identical reference numerals, and are omitted in further description. Each of the frequency doublers 10 above is capable of controlling the duty cycle of the clock signal output from the frequency doubler 10 to the SEL terminal of the half-rate MUX 222, to 50%.

In the case depicted in FIG. 24, because the duty cycle of the clock signal output from the frequency doubler 10 to the SEL terminal of the half-rate MUX 222 is 50%, the period during which the signal input to the InputC terminal (A1 to A8) is output is equivalent to the period during which the signal input to the InputD terminal (B1 to B8) is output, thereby facilitating discrimination of each signal at the reception side.

Figure 25:
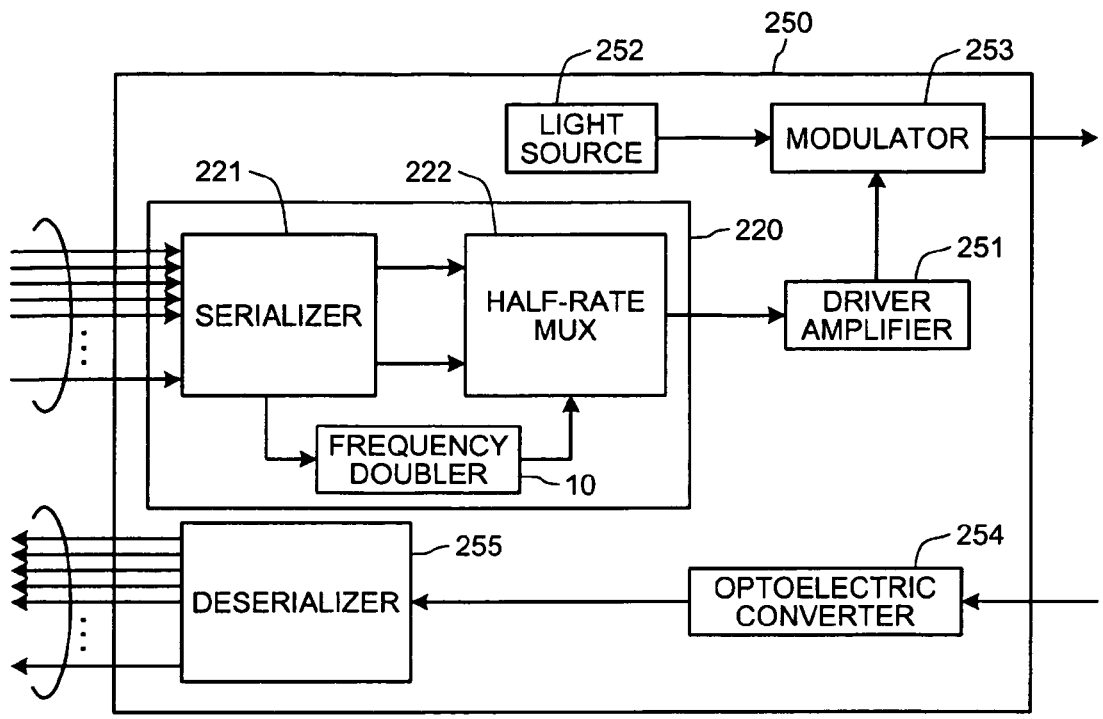
FIG. 25 is a block diagram of a transponder having the signal generator depicted in FIG. 22.

FIG. 25 is a block diagram of a transponder having the signal generator depicted in FIG. 22. A transponder 250 depicted in FIG. 25 function of serving as a transmitter that converts parallel electrical signals into a serial optical signal and transmits the serial optical signal, and a function of serving as an optical receiver that receives a serial optical signal to convert the serial optical signal into a parallel electrical signal.

The transponder 250 includes the signal generator 220, a driver amplifier 251, a light source 252, a modulator 253, an optoelectrical converter 254, and a deserializer 255. The signal generator 220 is the signal generator 220 depicted in FIG. 22. External parallel electrical signals are input to the signal generator 220. The signal generator 220 outputs, to the driver amplifier 251, a serial electrical signal generated from the input parallel electrical signals.

The driver amplifier 251 outputs a modulation signal based on a serial signal output from the signal generator 220, to the modulator 253. The light source 252 outputs continuous light to the modulator 253, which modulates the continuous light output from the light source 252, based on the modulation signal output from the driver amplifier 251, and transmits the modulated optical signal to an external destination.

The optoelectrical converter 254 receives an external serial optical signal input thereto, and converts the received optical signal into an electrical signal by optoelectrical conversion and outputs the converted signal to the deserializer 255. The deserializer 255 converts the serial electrical signal output from the optoelectrical converter 254 into parallel electrical signals, and outputs the converted parallel electrical signals to an external destination.

In the transponder 250, the signal generator 220 converts parallel electrical signals into a serial optical signal to output a precisely serialized signal to the driver amplifier 251, thereby enabling precise modulation of continuous light, which improves the quality of the optical signal transmitted.

Figure 26:
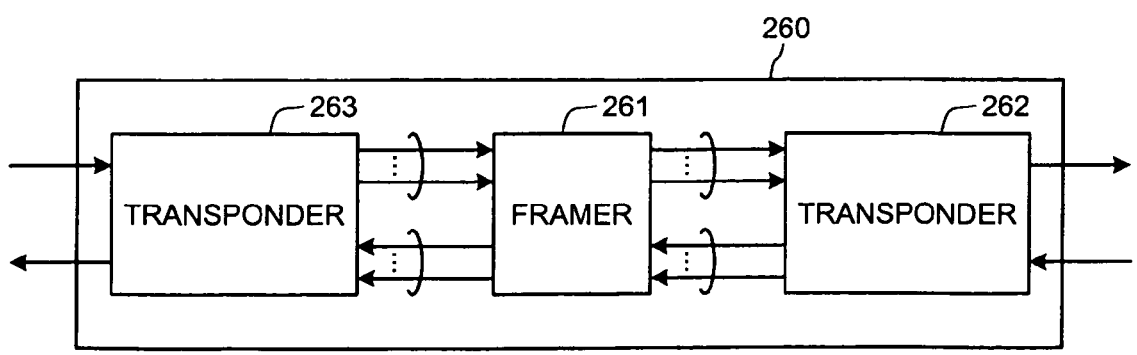
FIG. 26 is a block diagram of an optical communication apparatus having the transponder depicted in FIG. 25.

FIG. 26 is a block diagram of an optical communication apparatus having the transponder depicted in FIG. 25. An optical communication apparatus 260 depicted in FIG. 26 is a communication apparatus that transmits/receives an optical signal, serving as, for example, an optical relay apparatus in an optical communication system. The optical communication apparatus 260 includes a framer 261, and transponders 262 and 263.

The framer 261 performs a framing process on parallel electrical signals output from the transponder 262, and outputs the parallel electrical signals subjected to the framing process to the transponder 263. The framer 261 further performs the framing process on parallel electrical signals output from the transponder 263, and outputs the parallel electrical signals subjected to the framing process to the transponder 262.

Each of the transponders 262 and 263 have a configuration identical to that of the transponder 250 depicted in FIG. 25. The transponder 262 converts parallel electrical signals output from the framer 261 into a serial optical signal and transmits the serial optical signal to an external destination, and converts an external serial optical signal input thereto into an electrical signal and outputs the electrical signal to the framer 261.

The transponder 263 converts parallel electrical signals output from the framer 261 into a serial optical signal and transmits the serial optical signal to an external destination, and converts an external serial optical signal input thereto into an electrical signal and outputs the electrical signal to the framer 261. As described above, the transponders 262 and 263 can improve the quality of the optical signal transmitted, thereby enabling the optical communication apparatus 260 to perform quality communication.

The signal generator 220 of the fifth embodiment can convert parallel electrical signals into a serial electrical signal using a clock signal whose duty cycle is controlled precisely by the frequency doubler 10, thus can generate a precisely serialized signal. The optical communication apparatus 260 and the transponder 250 having the signal generator 220 can improve the quality of the signal transmitted.

Figure 27:
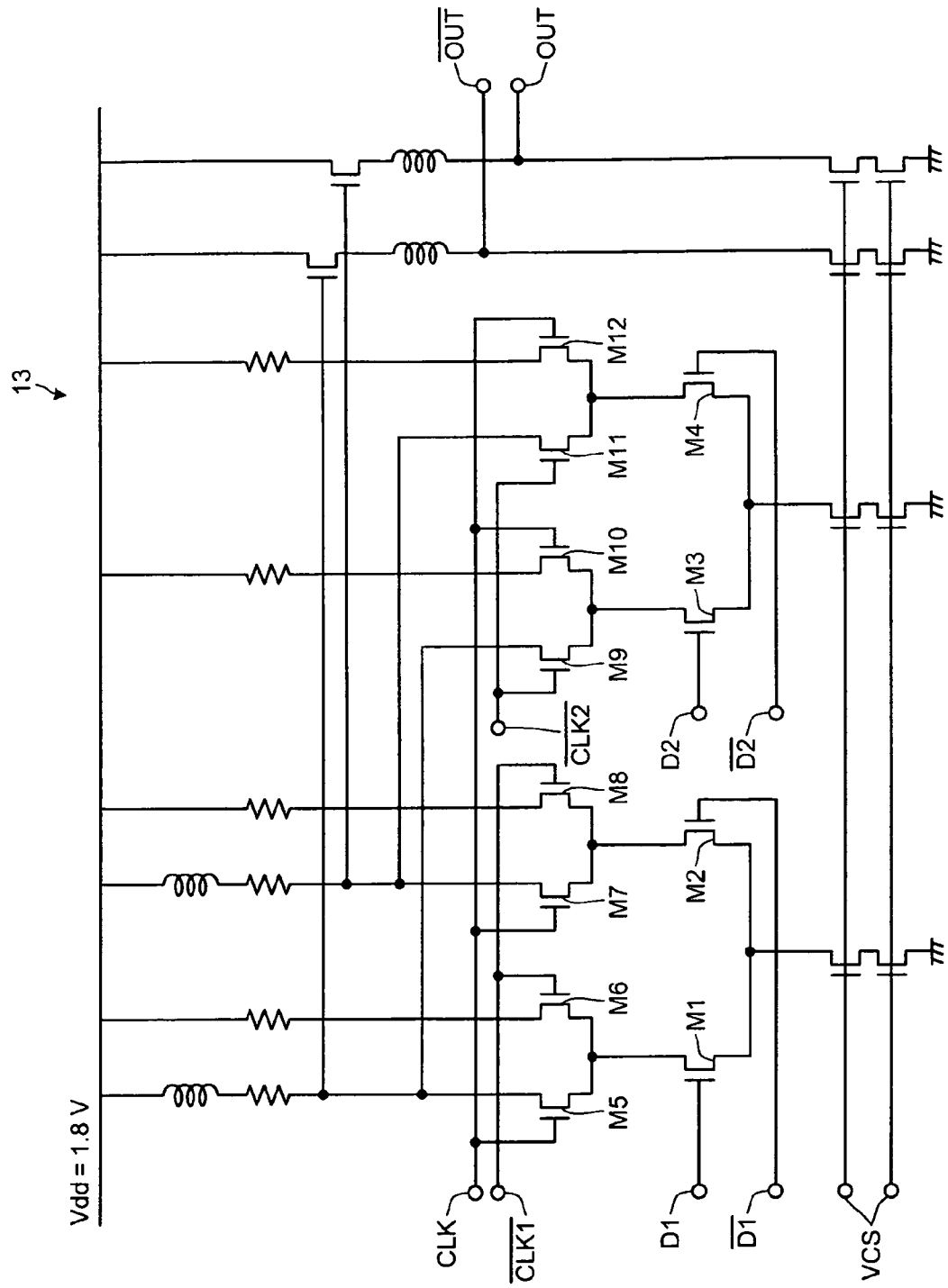
FIG. 27 is a circuit diagram of another exemplary configuration of the selector depicted in FIG. 1.

FIG. 27 is a circuit diagram of another exemplary configuration of the selector depicted in FIG. 1. In FIG. 27, constituent elements identical to those described in FIG. 4 are denoted by identical reference numerals, and are omitted in further description. Input terminals CLK 1-bar and CLK 2-bar are equivalent to the Ref terminal of the selector 13 depicted in FIG. 1. As depicted in FIG. 27, each reference voltage input unit is formed separately on input terminals D1 and D1-bar and on input terminals D2 and D2-bar, thereby enabling each reference voltage to be set separately for the input terminals D1 and D1-bar and for the input terminals D2 and D2-bar.

As described above, according to the frequency doubler, the signal generator, the optical transmitter, and the optical communication apparatus disclosed herein, the duty cycle of a clock signal can be controlled precisely even if fabrication variation and/or time-dependent changes of a circuit exist.

In the embodiments above, the duty cycle of the clock signal output from the frequency doubler 10 is controlled to 50%. The frequency doubler 10, however, is not limited in application to the use of controlling the duty cycle to 50%. The frequency doubler 10 is capable of arbitrarily controlling the duty cycle of the clock signal by changing a reference voltage supplied to the selector 13. The duty cycle of the clock signal may be controlled to, for example, 30% or to 70%.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A frequency doubler comprising:
an input unit that receives input of a first signal having a voltage that varies continuously;
a selector that outputs a second signal having a voltage that is switched alternately in synchronization with the first signal from the input unit;
a calculating circuit that outputs, as a clock signal, an exclusive-OR of the first signal input from the input unit and the second signal output from the selector; and
a supply unit that supplies a constant, reference voltage,
wherein the selector outputs the second signal having a voltage that is switched alternately each time the voltage of a signal obtained by delaying the first signal input from the input unit shifts across the constant reference voltage supplied by the supply unit.

2. The frequency doubler according to claim 1, wherein the constant reference voltage supplied by the supply unit is higher than a minimum voltage of the first signal input to the selector and lower than a maximum voltage of the first signal.

3. The frequency doubler according to claim 1, wherein the selector receives input of branches of the first signal from the input unit, and outputs the second signal obtained by alternately switching each of the branches.

4. The frequency doubler according to claim 3, further comprising a delay unit that delays at least one of the branches to synchronize the branches with each other.

5. The frequency doubler according to claim 1, further comprising a delay unit that, among branches of the first signal from the input unit and the second signal output from the selector to the calculating circuit, delays at least one and adjusts a delay difference between the branches to one-fourth of a frequency of the first signal.

6. The frequency doubler according to claim 1, further comprising:
a detecting unit that detects a duty cycle of the clock signal output from the calculating circuit; and
a control unit that, based on the duty cycle detected by the detecting unit, controls the constant reference voltage supplied from the supply unit to the selector.

7. The frequency doubler according to claim 6, wherein the detecting unit includes:
a differential amplifier that differentially amplifies the clock signal output from the calculating circuit,
a first integrator that averages a non-inverted output signal from the differential amplifier;

a second integrator that averages an inverted output signal from the differential amplifier; and a comparing circuit that outputs, as information indicative of the duty cycle, a difference between the non-inverted output signal averaged by the first integrator and the inverted output signal averaged by the second integrator.

8. The frequency doubler according to claim 7, wherein the control unit controls the constant reference voltage so that the difference output from the comparing circuit is minimized.

9. The frequency doubler according to claim 1, wherein the selector outputs the second signal having a voltage alternately switched between voltages corresponding to a positive potential side voltage and a negative potential side voltage, the positive potential side voltage and the negative potential side voltage each being applied to the selector.

10. The frequency doubler according to claim 9, further comprising a switch that interchanges the positive potential side voltage and the negative potential side voltage applied to the selector.

* * * * *